(12) United States Patent
Oh et al.

(10) Patent No.: US 7,930,622 B2
(45) Date of Patent: Apr. 19, 2011

(54) METHOD OF ENCODING AND DECODING ADAPTIVE TO VARIABLE CODE RATE USING LDPC CODE

(75) Inventors: Min Seok Oh, Seoul (KR); Kyu Hyuk Chung, Seoul (KR)

(73) Assignee: LG Electronics Inc., Seoul (KR)

( * ) Notice: Subject to any disclaimer, the term of this patent is extended or adjusted under 35 U.S.C. 154(b) by 760 days.

(21) Appl. No.: 11/571,296

(22) PCT Filed: Jun. 24, 2005

(86) PCT No.: PCT/KR2005/001990
§ 371 (c)(1),
(2), (4) Date: Jan. 15, 2008

(87) PCT Pub. No.: WO2006/001668
PCT Pub. Date: Jan. 5, 2006

(65) Prior Publication Data
US 2008/0256425 A1    Oct. 16, 2008

(30) Foreign Application Priority Data

Jun. 24, 2004    (KR) .................. 10-2004-0047899

(51) Int. Cl.
*H03M 13/00* (2006.01)
*G06F 11/00* (2006.01)
(52) U.S. Cl. .................. 714/801; 714/755; 714/786
(58) Field of Classification Search .................. 714/801, 714/755, 786
See application file for complete search history.

(56) References Cited

U.S. PATENT DOCUMENTS

2003/0037298 A1    2/2003  Eleftheriou
2005/0246606 A1*   11/2005 Cameron et al. .............. 714/752

FOREIGN PATENT DOCUMENTS

| CN | 1189019     | 7/1998  |
|----|-------------|---------|
| EP | 1 596 501 A1| 11/2005 |

OTHER PUBLICATIONS

A. Dholakia et al., "Rate-Compatible Low-Density Parity-Check Codes for Digital Subscriber Lines," IEEE International Conference on Communications, vol. 1, pp. 415-419, Jul. 2004.
P. Joo et al., "LDPC Coding for OFDMA PHY," IEEE 802.16 Broadband Wireless Access Working Group, IEEE C802.16d-04/86r1, May 2004.
M. R. Yazdani et al., "On Construction of Rate-Compatible Low-Density Parity-Check Codes," IEEE Communications Letters, vol. 8, No. 3, pp. 159-161, Mar. 2004.
Jacobsen, E., et al., "Draft Text for LDPC Coding Scheme for OFDMA," IEEE 802.16 Broadband Wireless Access Working Group, IEEE C802.16d-04/82, Apr. 26, 2004.

* cited by examiner

*Primary Examiner* — Guy J Lamarre
(74) *Attorney, Agent, or Firm* — Lee, Hong, Degerman, Kang & Waimey

(57) ABSTRACT

A variable code rate adaptive encoding/decoding method using LDDC code is disclosed, in which an input source data is encoded using the LDPC (low density parity check) code defined by a first parity check matrix configured with a plurality of submatrices. The present invention includes the steps of generating a second parity check matrix corresponding to a code rate by reducing a portion of a plurality of submatrices configuring a first parity check matrix according to the code rate to be applied to encoding an input source data and encoding the input source data using the second parity check matrix.

14 Claims, 4 Drawing Sheets

FIG. 2

$$H = \begin{pmatrix} 1 & 0 & 0 & 1 & | & 0 & 1 & 0 & 1 \\ 0 & 1 & 1 & 0 & | & 1 & 0 & 1 & 0 \\ 1 & 0 & 1 & 0 & | & 0 & 1 & 0 & 0 \\ 0 & 0 & 0 & 1 & | & 1 & 0 & 1 & 0 \end{pmatrix}$$

$$\underbrace{\phantom{1\ 0\ 0\ 1}}_{H_d} \quad \underbrace{\phantom{0\ 1\ 0\ 1}}_{H_p}$$

FIG. 3

| (1,1) Submatrix | (1,2) Submatrix | (1,3) Submatrix | (1,4) Submatrix |
|---|---|---|---|
| (2,1) Submatrix | (2,2) Submatrix | (2,3) Submatrix | (2,4) Submatrix |

FIG. 4

| (1,1) Submatrix | (1,2) Submatrix | (1,3) Submatrix | (1,4) Submatrix |
|---|---|---|---|
| (2,1) Submatrix | (2,2) Submatrix | (2,3) Submatrix | (2,4) Submatrix |

FIG. 5

| (1,1) Submatrix | (1,2) Submatrix | (1,3) Submatrix | (1,4) Submatrix |
|---|---|---|---|
| (2,1) Submatrix | (2,2) Submatrix | (2,3) Submatrix | (2,4) Submatrix |

FIG. 6

| (1,1) Submatrix | (1,2) Submatrix | (1,3) Submatrix | (1,4) Submatrix |
|---|---|---|---|
| (2,1) Submatrix | (2,2) Submatrix | (2,3) Submatrix | (2,4) Submatrix |

US 7,930,622 B2

METHOD OF ENCODING AND DECODING ADAPTIVE TO VARIABLE CODE RATE USING LDPC CODE

CROSS-REFERENCE TO RELATED APPLICATIONS

This application is a 371 U.S. national stage application of International Application No. PCT/KR2005/001990, filed on Jun. 24, 2005, which claims priority to Korean Application No. 10-2004-0047899, filed on, Jun. 24, 2004, the contents of which are incorporated by reference herein in their entirety.

TECHNICAL FIELD

The present invention relates to an encoding/decoding method, and more particularly, to a variable code rate adaptive encoding/decoding method using LDDC code. Although the present invention is suitable for a wide scope of applications, it is particularly suitable for effectively adapting a low density parity check (hereinafter abbreviated LDPC) code to a communication system having a variable code rate applied thereto.

BACKGROUND ART

Generally, encoding is a process that a transmitting side performs a data processing for a receiving side to restore original data despite errors caused by signal distortion, loss and the like while the transmitting side transmits data via a communication channel. And, decoding is a process that the receiving side restores the encoded transmitted data into the original data.

Recently, many attentions are paid to an encoding method using an LPDC code. The LDPC code is a linear block code having low density since most of elements of a parity check matrix H are zeros, which was proposed by Gallager in 1962. It was difficult to implement the LDPC code that is very complicated due to the technological difficulty in those days. Yet, the LDPC code was taken into re-consideration in 1995 so that its superior performance has been verified. So, many efforts are made to research and develop the LPDC code. (Reference: [1] Robert G. Gallager, "Low-Density Parity-Check Codes", The MIT Press, Sep. 15, 1963. [2] D. J. C. Mackay, Good error-correcting codes based on very sparse matrices, IEEE Trans. Inform. Theory, IT-45, pp. 399-431 (1999))

A parity check matrix of the LDPC code is a binary matrix including '0' and '1'. Since the number of '1' of the parity check matrix of the LDPC code is very small, decoding of the parity check matrix of the LDPC is enabled through repetition decoding in case of a large matrix size. If the matrix size is very large, the parity check matrix of the LDPC code shows performance approximating a channel capacity limit of Shannon like a turbo code.

The LDPC code can be explained by a parity check matrix H of (n−k)×n dimension. And, a generator matrix G corresponding to the parity check matrix H can be found by Formula 1.

$$H \cdot G = 0 \qquad \text{[Formula 1]}$$

In an encoding/decoding method using an LDPC code, a transmitting side encodes input data by Formula 2 using the generator matrix G having a relation of Formula 1 with the parity check matrix H.

[Formula 2]

c=G·u, where 'c' is a codeword and 'U' is a data frame.

Yet, an input data encoding method using the parity check matrix instead of the generator matrix G is generally used nowadays. Hence, as explained in the above explanation, the parity check matrix H is the most important factor in the encoding/decoding method using the LDPC code.

Meanwhile, in the latest mobile communication system or wireless Internet system, a variable code rate scheme, which encodes input source data by varying a code rate according to a channel status or a data volume to be transmitted, is generally employed. And, a code rate 'r' can be expressed by Formula 3.

[Formula 3]

r=k/3, where 'k' is a source data length and 'n' is an encoded data (codeword) length.

The encoded data (codeword) consists of systematic bits and parity bits. The systematic bits means source data prior to encoding and the parity bits mean a portion added to a rear part of the systematic bits. The 'n' is a total value of the systematic bits number and the parity bits number. To raise the code rate, the parity bits can be reduced. To lower the code rate, the systematic bits can be reduced.

The parity bits reducing scheme is generally used in case of a good channel status. Yet, the systematic bits reducing scheme is used in case of a poor channel status.

However, although various schemes for the variable code rate applications to the encoding/decoding method using the turbo or convolution code have been proposed, a method of applying the variable code rate to the encoding/decoding method using the LDPC code is not known yet.

DISCLOSURE OF THE INVENTION

Accordingly, the present invention is directed to a variable code rate adaptive encoding/decoding method using LDDC code that substantially obviates one or more of the problems due to limitations and disadvantages of the related art.

An object of the present invention is to provide a variable code rate adaptive encoding/decoding method using LDDC code, by which a low density parity check (LDPC) code is applicable to a system employing a variable code rate.

Another object of the present invention is to provide a variable code rate adaptive encoding/decoding method using LDDC code, by which a row or column weight can be made to have regularity for an overall parity check matrix H in case of changing the party check matrix H to apply a variable code rate to a communication system.

Additional features and advantages of the invention will be set forth in the description which follows, and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in encoding using a parity check matrix including a plurality of submatrices, a variable code rate adaptive encoding method according to the present invention includes the steps of generating a second parity check matrix corresponding to a code rate by reducing a portion of a plurality of submatrices configuring a first parity check matrix according to the code rate to be applied to encoding an input source data and encoding the input source data using the second parity check matrix.

To further achieve these and other advantages and in accordance with the purpose of the present invention, in encoding using a parity check matrix including a plurality of submatrices, a variable code rate adaptive decoding method includes the steps of generating a second parity check matrix corresponding to a code rate applied to an encoded data by reducing a portion of a plurality of submatrices configuring a first parity check matrix according to the code rate and decoding the encoded data using the second parity check matrix.

Preferably, a row weight and column weight of each of a plurality of the submatrices of the first parity check matrix has uniform regularity. More preferably, the row weight and column weight of each of a plurality of the submatrices of the first parity check matrix is either 0 or 1.

Preferably, if the first parity check matrix has a configuration of H [$H_d|H_p$], a row weight and column weight of each submatrix configuring the $H_d$ is 1. More preferably, the $H_p$ is a dual diagonal matrix. More preferably, any random two rows of the $H_d$ do not have 1 on at least two points simultaneously.

Preferably, in the second parity check matrix generating step, in case of reducing parity bits, the submatrices belonging to a random column by a submatrix unit are eliminated from a plurality of the submatrices configuring the first parity check matrix and the submatrices belonging to a random row by the submatrix unit are eliminated from a plurality of the submatrices configuring the first parity check matrix. More preferably, if the first parity check matrix has a configuration of H=[$H_d|H_p$], the eliminated column of the submatrix unit belongs to the $H_p$.

Preferably, in the second parity check matrix generating step, in case of reducing systematic bits, the submatrices belonging to a random column by a submatrix unit are eliminated from a plurality of the submatrices configuring the first parity check matrix. More preferably, if the first parity check matrix has a configuration of H=[$H_d|H_p$], the eliminated column of the submatrix unit belongs to the $H_d$.

Preferably, in the second parity check matrix generating step, in case of reducing parity bits and systematic bits simultaneously, the submatrices belonging to a random row and column by a submatrix unit are eliminated from a plurality of the submatrices configuring the first parity check matrix.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 2 is an exemplary diagram for explaining a relation of H=[$H_d|H_p$];

FIG. 3 is an exemplary diagram of an example of a parity check matrix H according to one preferred embodiment of the present invention;

FIG. 4 is a diagram for explaining a case of reducing parity bits according to one preferred embodiment of the present invention;

FIG. 5 is a diagram for explaining a case of reducing systematic bits according to one preferred embodiment of the present invention;

FIG. 6 is a diagram for explaining a case of reducing parity bits and systematic bits according to one preferred embodiment of the present invention.

BEST MODE FOR CARRYING OUT THE INVENTION

Reference will now be made in detail to the preferred embodiments of the present invention, examples of which are illustrated in the accompanying drawings.

Figure 1:
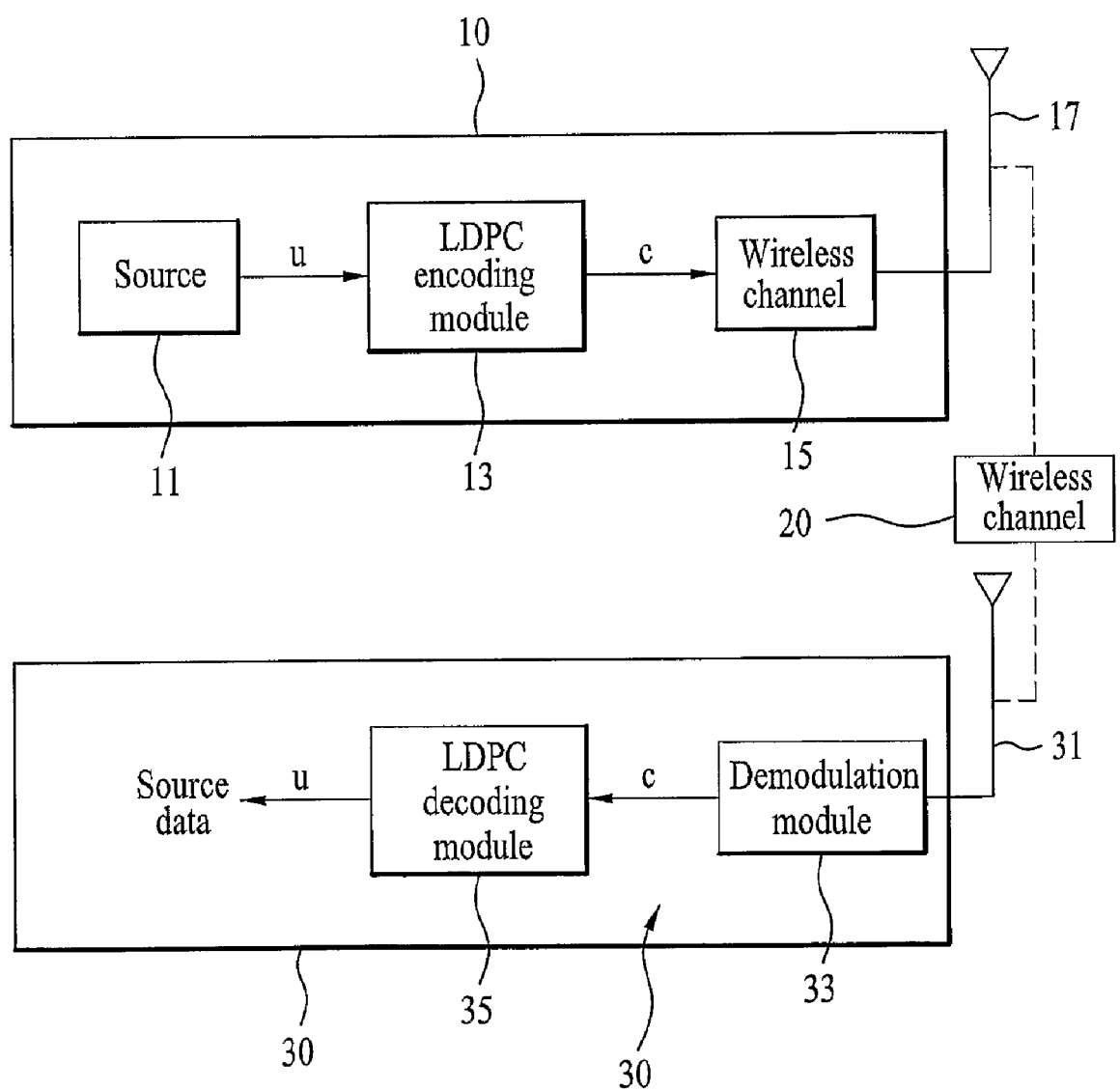
FIG. 1 is a block diagram of a communication system to explain one preferred embodiment of the present invention.

FIG. 1 is a block diagram of a communication system to explain one preferred embodiment of the present invention, in which a technical feature of the present invention is applied to a wireless communication system for example.

Referring to FIG. 1, a transmitter 10 and a receiver communicate with each other using a wireless channel as a medium. In the transmitter 10, a k-bit source data u outputted from a data source 11 is converted to an n-bit codeword c by LDPC encoding of an LDPC encoding module 13. The codeword c is wireless-modulated by a modulation module 15, is transmitted via an antenna 17, and is then received by another antenna 31 of the receiver 30. In the receiver, original data is restored through a process reverse to that of the transmitter 10. Namely, the source data u can be finally obtained by demodulation of a demodulation module 33 and decoding of an LDPC decoding module 35.

The above explained data transmitting/receiving process is described within a minimum range required for explaining the features of the present invention. So, it is apparent to those skilled in the art that the corresponding process needs more procedures for the data transmission/reception.

The transmitter 10 stores a first (master) parity check matrix H according to a basic code rate. The transmitter 10 determines a code rate r that will be applied to encoding of an input source data by considering a channel status, a data volume to be transmitted and the like. Once the code rate is determined, a size of the first parity check matrix H according to the determined code rate to encode the input source data. An encoding process is explained in detail as follows.

In Formula 1, the first parity check matrix H can be expressed by H=[$H_d|H_p$] ($H_d$ is (n−k)×k dimensional, $H_p$ is (n−k)×(n−k) dimensional). FIG. 2 is an exemplary diagram for explaining a relation of H=[$H_d|H_p$]. The 'k' is a length (bit unit) of the source data inputted to the LDPC encoding module 13 and the 'n' means a length (bit unit) of the encoded codeword c.

By Formula 1 and the relation of H=[$H_d|H_p$], it can be known that G=[I|($H_p^{-1}H_d$)$^t$]$^t$. Hence, the LDPC encoding module 13 performs encoding in a manner of multiplying the input data u by 'G=[I|($H_p^{-1}H_d$)$^t$]$^t$' by Formula 2. Hence, Formula 2 can be replaced by Formula 4. In particular, a k-bit input source data $s_{1 \times x}$ is encoded into an n-bit codeword $x_{1 \times x}$ by Formula 2. A codeword x has a configuration of x=[s p]=[$s_0, s_1, \ldots, s_{k-1}, p_0, p_1, \ldots, p_{m-1}$], where ($p_0, p_1, \ldots, p_{m-1}$) are parity check bits) and ($s_0, s_1, \ldots, s_{k-1}$) are systematic bits.

$$c=[I|(H_p^{-1}H_d)^t]^t \cdot u \qquad \text{[Formula 4]}$$

Yet, the encoding scheme using the generator matrix G is very complicated. To reduce such a complexity, it is preferable that the input source data is directly encoded using the parity check matrix X. Namely, since x=[s p], H·x=H·[s p]=0 if using a characteristic of H·x=0. From the formula, a parity check bit p can be obtained to finally find the code word x=[s p].

FIG. 3 is an exemplary diagram of an example of a parity check matrix H according to one preferred embodiment of the present invention, in which an example of a first parity check matrix H configured with eight submatrices is shown.

As mentioned in the foregoing description, the first parity check matrix H includes two parts $H_d$ and $H_p$. It is preferable that each row weight and column weight of the submatrices of the $H_d$ is '0' or '1'. If the row weight and column weight of each of the submatrices is '1', it means that there exists one '1' on a random row and column and that the rest are all zero. If the row weight and column weight of each of the submatrices is '0', it means that each of the submatrices is a zero matrix.

It is also preferable that any random two rows of the $H_d$ do not have '1' on at least two points simultaneously. If any random two rows of the $H_d$ do not have '1' on at least two points simultaneously, it is impossible that '1' cannot exist on at least two points when two random rows are compared to each other among the entire $H_d$. If this condition is met, it is also impossible that '1' cannot exist on at least two points when two random columns are compared to each other among the entire $H_d$.

The present invention is characterized in being adaptive to a case that a code rate is needed to be varied due to a channel status or the like by varying a size of the first parity check matrix H in a manner of eliminating the submatrices.

In case of reducing parity bits, submatrices belonging to a random column are eliminated from the submatrices configuring the $H_p$ by submatrix unit or submatrices belonging to a random row are eliminated from the submatrices configuring the $H_p$ or $H_d$ by submatrix unit. If the parity bits are reduced, a code rate becomes greater than the basic code rate.

FIG. 4 is a diagram for explaining a case of reducing parity bits according to one preferred embodiment of the present invention, in which a temporary parity check matrix is configured with (1, 1), (1, 2) and (1, 3) submatrices only by eliminating (1, 4), (2, 1), (2, 2), (2, 3) and (2, 4) submatrices to reduce parity bits for the first parity check matrix H basically having the configuration in FIG. 2.

Referring to FIG. 4, (1, 1) and (1, 2) submatrices configure $H_d$ and a submatrix (1, 3) configures $H_p$, whereby a code rate r=⅔. In FIG. 4, by eliminating (1, 3), (2, 1), (2, 2), (2, 3) and (2, 4) submatrices, it is also able to reduce parity bits. Since each row weight and column weight of the submatrices configuring $H_d$ is '0' or '1', it is able for the $H_d$ to maintain the basic feature that a weight of random row and column of the remaining matrix after eliminating several submatrices is '0' or '1'. It is also possible to set each row and column weight of the submatrices to '1'.

In case of reducing systematic bits, submatrices belonging to a random column are eliminated by submatrix unit from submatrices configuring the $H_d$. by reducing the systematic bits, it is able to make a code rate smaller than the basic code rate.

FIG. 5 is a diagram for explaining a case of reducing systematic bits according to one preferred embodiment of the present invention, in which *1, 1) and (2, 1) submatrices are eliminated to reduce systematic bits for the first parity check matrix H basically having the configuration in FIG. 2.

Referring to FIG. 5, systematic bits can be reduced by eliminating (1, 2) and (2, 2) submatrices instead of (1, 1) and (2, 1) submatrices.

In case of reducing parity and systematic bits simultaneously, submatrices are eliminated by submatrix unit from submatrices configuring the $H_p$ and the $H_d$ in column and row directions.

FIG. 6 is a diagram for explaining a case of reducing parity bits and systematic bits according to one preferred embodiment of the present invention, in which an example of combining the explanations of FIG. 4 and FIG. 5 is shown.

Referring to FIG. 6, parity bits and systematic bits can be simultaneously reduced.

Table 1 shows an example of adjusting a code rate by reducing parity bits and systematic bits. In Table 1, 'r' is a code rate, 'k' is a source data length, and 'n; is an encoded data (codeword) length.

TABLE 1

| r = k/n | n | k | n − k |
| --- | --- | --- | --- |
| 2/3 (Master: 4 × 12 submatrix) | 2400 | 1600 | 800 |
| 1/2 (rs) | 1600 | 800 | 800 |
| 4/5 (rp) | 2000 | 1600 | 400 |
| 2/3 (rs & rp) | 1200 | 800 | 400 |

In Table 1, 'Master: 4×12 submatrix' means that the first parity check matrix H, i.e., 'H' shown in FIG. 3 is 4×12. And, a total number of submatrices is 48. '½(rs)' means a case that a code rate is changed into ½ by reducing systematic bits. '⅘(rs)' means a case that a code rate is changed into ⅘ by reducing parity bits. And, '⅔(rs & rp)' means a case that a code rate is changed into ⅔ by reducing systematic and parity bits.

The variable code rate adaptive decoding method using the LDPC code according to the present invention can correspond to a process reverse to the above explained encoding method. In FIG. 1, the receiver 30 receives the encoded data transmitted from the transmitter 10 and receives a code rate applied to the encoded data from the transmitter 10 by signaling or the like.

The receiver eliminates a portion of a plurality of submatrices configuring the first parity check matrix by the above method to generate a second parity check matrix corresponding to the code rate delivered from the transmitter 10. The receiver 30 then decodes the encoded data using the second parity check matrix. In deciding a presence or non-presence of transmission error, the receiver 30 receives the encoded data and uses Formula 5.

{Table 5}

$$H \cdot c = 0$$

Namely, if '0' results from multiplying an encoded data c by the second parity check matrix, it means that there is no transmission error. Otherwise, it means that a transmission error exists. Hence, the source data can be separated.

By the encoding/decoding method using the LDPC code according to the present invention, the LDPC code can be effectively adapted to the system employing the variable data rate. Even if the parity check matrix H is changed to apply the variable data rate to the communication system, the present invention can maintain the regularity of the row or column weight for the entire parity check matrix H. Hence, the encoding and decoding can be efficiently performed.

Figure 7:
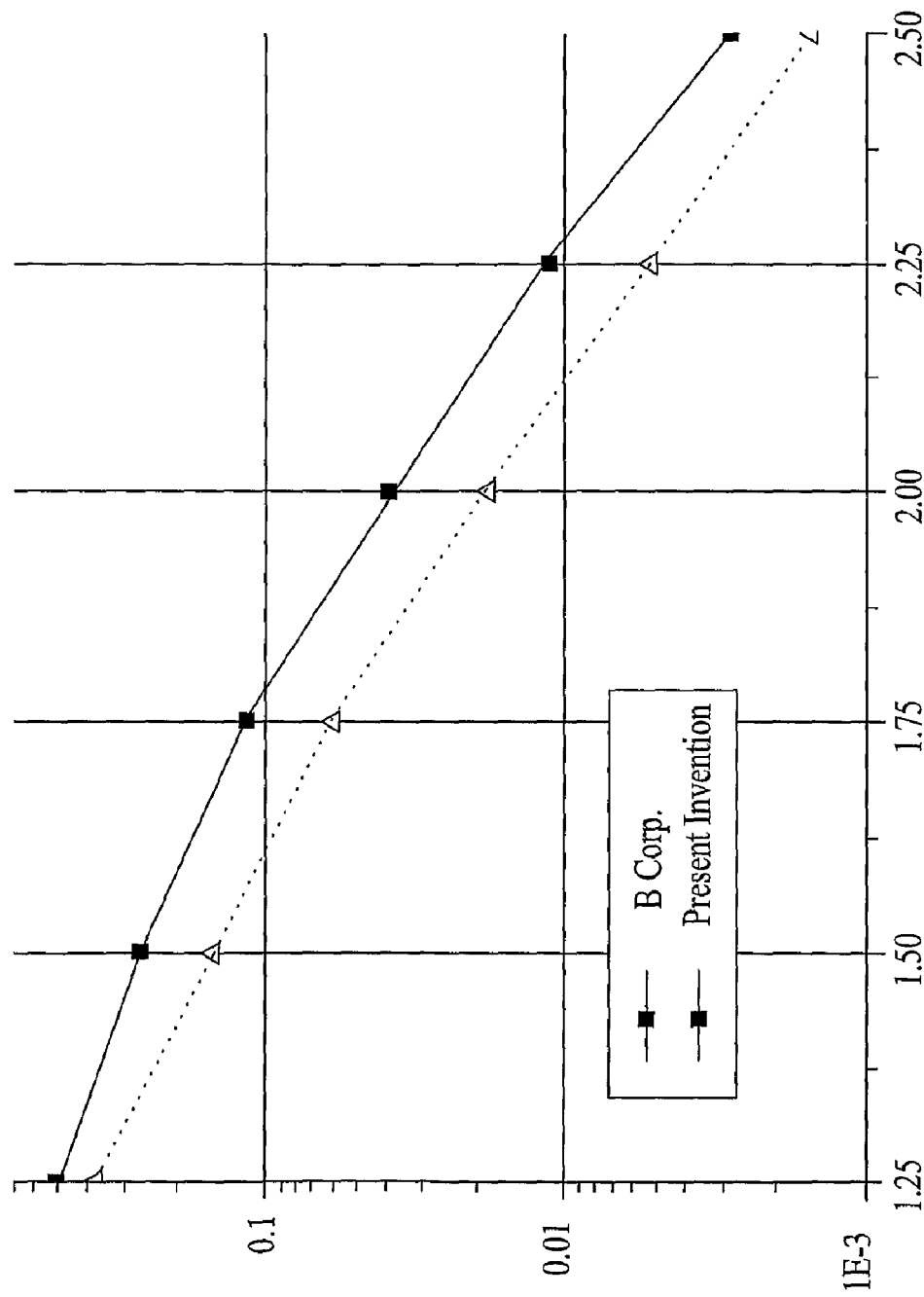
FIG. 7 is a performance comparison graph between the present invention and a related art under the same condition.

FIG. 7 is a performance comparison graph between the present invention and a related art under the same condition.

Referring to FIG. 7, LDPC encoding is carried out by an 800×600-dimensional parity check matrix. An LDPC code of the present invention is very advantageous in aspect of FER or Eb/No. And, it is proved that complexity can be lowered in implementing an LDPC encoder.

INDUSTRIAL APPLICABILITY

Accordingly, the present invention provides the following effect or advantage.

First of all, the variable code rate adaptive encoding/decoding method using LDDC code of the present invention is applicable to a system employing a variable code rate scheme such as a mobile communication system, a mobile Internet system and the like.

While the present invention has been described and illustrated herein with reference to the preferred embodiments thereof, it will be apparent to those skilled in the art that various modifications and variations can be made therein without departing from the spirit and scope of the invention. Thus, it is intended that the present invention covers the modifications and variations of this invention that come within the scope of the appended claims and their equivalents.

What is claimed is:

1. A method of encoding adaptive to a variable code rate using a parity check matrix including a plurality of submatrices, the method comprising:
   generating a second parity check matrix corresponding to a code rate by reducing a portion of a plurality of submatrices configuring a first parity check matrix $H=[H_d|H_p]$ according to the code rate for encoding an input source data,
   wherein the $H_d$ is a (n−k)×k matrix and the $H_p$ is a (n−k)×(n−k) matrix where k is a length of systematic bits and n−k is a length of parity bits; and
   encoding the input source data using the second parity check matrix,
   wherein generating the second parity check comprises eliminating submatrices belonging to a column of the $H_p$ by a submatrix unit from the plurality of the submatrices configuring the first parity check matrix and eliminating submatrices belonging to a row by the submatrix unit from the plurality of the submatrices configuring the first parity check matrix.

2. The method of claim 1, wherein a row weight and column weight of each of the submatrices of the first parity check matrix has uniform regularity.

3. The method of claim 2, wherein the row weight and column weight of each of the submatrices of the first parity check matrix is either 0 or 1.

4. The method of claim 1, wherein a row weight and column weight of each submatrix configuring the $H_d$ is 1.

5. The method of claim 4, wherein the $H_p$ is a dual diagonal matrix.

6. The method of claim 4, wherein any random two rows of the $H_d$ do not have 1 on at least two points simultaneously.

7. The method of claim 1, wherein generating the second parity check matrix further comprises eliminating submatrices belonging to a column of the $H_d$ by a submatrix unit from a plurality of the submatrices configuring the first parity check matrix.

8. A method of decoding adaptive to a variable code rate using a parity check matrix including a plurality of submatrices, the method comprising:
   generating a second parity check matrix corresponding to a code rate applied to an encoded data by reducing a portion of a plurality of submatrices configuring a first parity check matrix $H=[H_d|H_p]$ according to the code rate,
   wherein the $H_d$ is a (n−k)×k matrix and the $H_p$ is a (n−k)×(n−k) matrix where k is a length of systematic bits and n−k is a length of parity bits; and
   decoding the encoded data using the second parity check matrix,
   wherein generating the second parity check comprises eliminating submatrices belonging to a column of the $H_p$ by a submatrix unit from the plurality of the submatrices configuring the first parity check matrix and eliminating submatrices belonging to a row by the submatrix unit from the plurality of the submatrices configuring the first parity check matrix.

9. The method of claim 8, wherein a row weight and column weight of each of a plurality of the submatrices of the first parity check matrix has uniform regularity.

10. The method of claim 9, wherein the row weight and column weight of each of a plurality of the submatrices of the first parity check matrix is either 0 or 1.

11. The method of claim 8, wherein a row weight and column weight of each submatrix configuring the $H_d$ is 1.

12. The method of claim 11, wherein the $H_p$ is a dual diagonal matrix.

13. The method of claim 11, wherein any random two rows of the $H_d$ do not have 1 on at least two points simultaneously.

14. The method of claim 8, wherein generating the second parity check matrix further comprises eliminating submatrices belonging to a column of the $H_d$ by a submatrix unit from a plurality of the submatrices configuring the first parity check matrix.

* * * * *